(12) United States Patent
Cox

(10) Patent No.: US 7,050,913 B2
(45) Date of Patent: May 23, 2006

(54) METHOD AND APPARATUS FOR MONITORING POWER QUALITY IN AN ELECTRIC POWER DISTRIBUTION SYSTEM

(75) Inventor: Roger W. Cox, Oakdale, PA (US)

(73) Assignee: Eaton Corporation, Cleveland, OH (US)

( * ) Notice: Subject to any disclaimer, the term of this patent is extended or adjusted under 35 U.S.C. 154(b) by 69 days.

(21) Appl. No.: 10/782,492

(22) Filed: Feb. 19, 2004

(65) Prior Publication Data

US 2005/0187725 A1    Aug. 25, 2005

(51) Int. Cl.
*G01R 21/00* (2006.01)

(52) U.S. Cl. .............................. 702/60; 702/61; 702/62; 702/65; 324/142; 361/80

(58) Field of Classification Search ................. 702/60, 702/61–62, 65, 59; 324/76.11, 76.15, 142; 361/66, 80
See application file for complete search history.

(56) References Cited

U.S. PATENT DOCUMENTS

| | | | |
|---|---|---|---|
| 5,587,917 A | 12/1996 | Elms | |
| 5,600,527 A | 2/1997 | Engel et al. | |
| 5,627,718 A | 5/1997 | Engel et al. | |
| 5,706,204 A | 1/1998 | Cox et al. | |
| 5,825,656 A | 10/1998 | Moore et al. | |
| 5,890,097 A | 3/1999 | Cox | |
| 5,899,960 A | 5/1999 | Moore et al. | |
| 6,005,759 A | 12/1999 | Hart et al. | |
| 6,269,316 B1 | 7/2001 | Hubbard et al. | |
| 6,374,188 B1 | 4/2002 | Hubbard et al. | |
| 6,459,997 B1 | 10/2002 | Andersen | |
| 6,611,773 B1 | 8/2003 | Przydatek et al. | |

*Primary Examiner*—John Barlow
*Assistant Examiner*—Hien Vo
(74) *Attorney, Agent, or Firm*—Martin J. Moran

(57) ABSTRACT

A composite power quality indication generated from user weighted statistical contributions of selected system parameters provides an overall indication of power quality in an electric power distribution system. The user defined weightings are maintained over time by continually updating sensitivities that normalize the component contributions to the composite power quality indication. The current composite power quality indication is displayed in relation to its long-term mean and to dynamic thresholds determined as multiples of the standard deviation of the long-term mean.

14 Claims, 3 Drawing Sheets

METHOD AND APPARATUS FOR MONITORING POWER QUALITY IN AN ELECTRIC POWER DISTRIBUTION SYSTEM

BACKGROUND OF THE INVENTION

1. Field of the Invention

The invention relates to a system and method for monitoring the performance of an electric power distribution system, and as one aspect, to the generation and presentation of a composite power quality indicator generated from user weighted statistical contributions of various system parameters.

2. Background Information

Various techniques have been employed for monitoring the performance of electric power distribution systems. State-of-the-art monitors calculate various electrical parameters such as RMS currents and voltages, peak currents and voltages, power, energy, power factor and the like. Waveform analyzers are used for oscillographic analysis of system waveforms. Numerous methods have been developed to measure and capture power quality events, such as current and voltage sags and swells, voltage surges and excessive harmonic distortion and flicker. However, the state-of-the-art power quality meters lack a means for telling the user whether the existing power quality is normal. For example, such meters will display and record values and minimum and maximum extremes. Nevertheless, until there is a triggered event, the user still does not know whether conditions are normal. Furthermore, attempts to predefine acceptable power quality levels fail to acknowledge unique attributes of a particular electrical system. In one known system, the triggers dynamically adjust to fill available hard disk space within a preprogrammed time period. However, the user still does not know whether the present values of the monitored parameters are normal. In addition, at present, there is no overall indication of power quality. Each parameter is evaluated separately.

SUMMARY OF THE INVENTION

The invention is directed to a system and method of monitoring power quality in an electric power distribution system that generates a composite power quality indicator that is a function of a plurality of system parameters. Each component of the indicator is weighted by a user programmable factor to emphasize or de-emphasize its affect. The composite power quality indicator is updated from statistics generated during a sampling period. As part of each update, each component of the composite power quality indicator is normalized by a sensitivity to a preset threshold before multiplication by the user assigned weighting factor. After multiplication, the results accumulate until they are totaled at the end of the sampling period. During the update, the sensitivity is adjusted to maintain the user selected weighting of the components.

More particularly, the method in accordance with one aspect of the invention is directed to repetitively determining the values of a plurality of selected parameters of the electric power distribution system, generating a composite power quality indicator from the values of the plurality of selected parameters and generating an output representing the composite power quality indicator. Generation of the composite power quality indicator can comprise performing a statistical analysis of the values of the plurality of selected parameters. The values of the plurality of selected parameters can be determined by generating samples of each of the plurality of selected parameters over a sampling period and determining the values from the samples generated during the sampling period.

As another aspect of the invention, the composite power quality indicator is generated by generating a power quality component for each of the plurality of selected parameters and combining the power quality components to produce the composite power quality indicator. Combining the power quality components can comprise assigning an associated weighting factor to each power quality component selected to produce a selected weighting of that power quality component, multiplying each power quality component by its associated weighting factor to generate a weighted power quality component and adding the weighted power quality components to generate the composite power quality indicator. Preferably, the selected weighting of each of the power quality components is maintained by determining an associated power quality component sensitivity and multiplying the power quality component by its power quality component sensitivity as well as the associated weighting factor. Each power quality sensitivity can be determined by maintaining a long-term mean value for each power quality component and a long-term mean value for the composite power quality indicator and multiplying the associated weighting factor by a ratio of the composite power quality indicator long-term mean to the power quality component long-term mean. Each power quality component sensitivity can be updated by multiplying the most recent power quality component sensitivity by the associated weighting factor and a ratio of the composite power quality indicator long-term mean to the power quality component long-term mean.

In accordance with another aspect of the invention, the composite power quality indicator is further generated by generating at least one dynamic threshold for the composite power quality indicator and generating the output includes generating a representation of the composite power quality indicator relative to the at least one dynamic threshold. The at least one dynamic threshold can be generated by generating a long-term mean of the composite power quality indicator, generating a standard deviation of the long-term mean and generating the at least one dynamic threshold as a function of the standard deviation. In this case, the output step further comprises generating a representation of the composite power quality indicator relative to its long-term mean and to the at least one dynamic threshold. The long-term mean of the composite power quality indicator can be generated as a moving average over a selected time. The generation of the composite power quality indicator over the selected time period can comprise generating a first moving average over a first time period and generating a second moving average over a second time period which is a multiple of the first time period. The composite power quality indicator is generated using only the first moving average until the method has been used for at least the second time period and then the composite power quality indicator is generated using the second moving average. In the exemplary embodiments of the invention, the first time period is one week and the second time period is one year.

As another aspect of the invention, a power quality monitor for an electric power distribution system comprises sensors for sensing current and voltages in the electric power distribution system, processing means comprising means for repetitively determining values of selected parameters from the currents and voltages and for statistically generating a composite power quality indicator from the values of the selected parameters, and output means providing a representation of the composite power quality indicator. The processing means can comprise means generating power quality components from the values of the selected parameters and combining the power quality components to generate the composite power quality indicator. The processing means can also comprise means generating a long-term mean of the composite power quality indicator and the output means can comprise a display displaying the composite power quality indicator relative to the long-term mean of the composite power quality indicator.

In addition, the processing means can comprise means generating a long-term mean of the composite power quality indicator, a standard deviation of the long-term of the composite power quality indicator and at least one dynamic threshold as a function of the standard deviation, and the output means can comprise a display displaying the composite power quality indicator relative to the long-term mean of the composite power quality indicator and relative to the at least one dynamic threshold. In a preferred form, the process means can comprise means generating a first dynamic threshold as a first function of the standard deviation and a second dynamic threshold as a second function of the standard deviation greater than the first function of the standard deviation, and wherein the display displays the first and second dynamic thresholds relative to the long-term mean to define a safe zone for the composite power quality indicator between the long-term mean and the first dynamic threshold, a caution zone between the first and second dynamic threshold and an alert zone farther from the long-term mean than the second dynamic threshold. Also, the processing means can comprise means generating the power quality components from values of the selected parameters, means providing a selected weighting of each power quality component by applying a selected weighting factor to that power quality component to generate weighted power quality components and means combining the weighted power quality components to generate the composite power quality indicator. The processing means can further comprise means maintaining the weighting of each power quality component by applying a continually adjusted sensitivity to each weighed power quality component derived from the long-term mean of the composite power quality indicator and a long-term mean of the power quality component.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
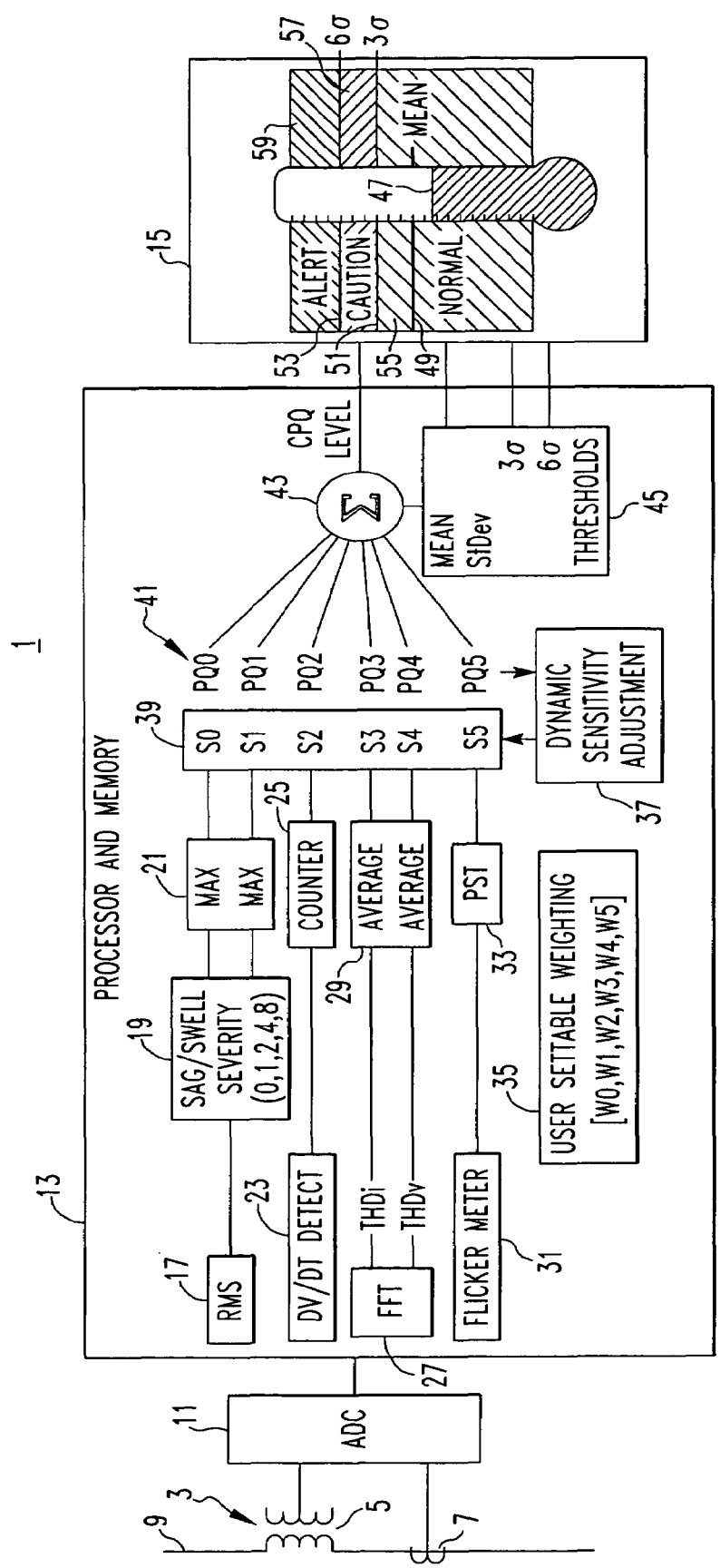
FIG. 1 is a schematic diagram of a power quality monitor in accordance with the invention.

The invention is directed to a method and a monitor that provides an overall indication of power quality in an electric power distribution system based upon what is normal for the monitored location. A statistical analysis is performed to maintain an indication of what is normal. A new value of the overall power quality is repetitively generated, every ten minutes in the exemplary monitor, for comparison with normal levels. Thus, referring to FIG. 1, the power quality monitor 1 includes sensors 3 such as potential transformers 5 and current transformers 7 that measure voltage and current, respectively, in the monitored electric power distribution system 9. While a single line representation is used for clarity, typically the electric power distribution system 9 would be a three-phase system, and hence, there would be a potential transformer 5 and current transformer 7 for each phase. The sensed currents and voltages are digitized by an analog to digital converter 11 for input to the processor 13. The power quality monitor 1 further includes an output device, which in the exemplary monitor is a display device 15 generating a visual display of the power quality indicator, which will be further described.

The sensed values of current and voltage in the electric power distribution system 1 are utilized by the processor 13 to evaluate parameters relevant to power quality. While there are various parameters that could be monitored, the exemplary monitor focuses on voltage sags and swells, rapid changes in voltage as measured by dv/dt, the percentages of total harmonic distortion (THD) in voltage and in current, and flicker.

Figure 2:
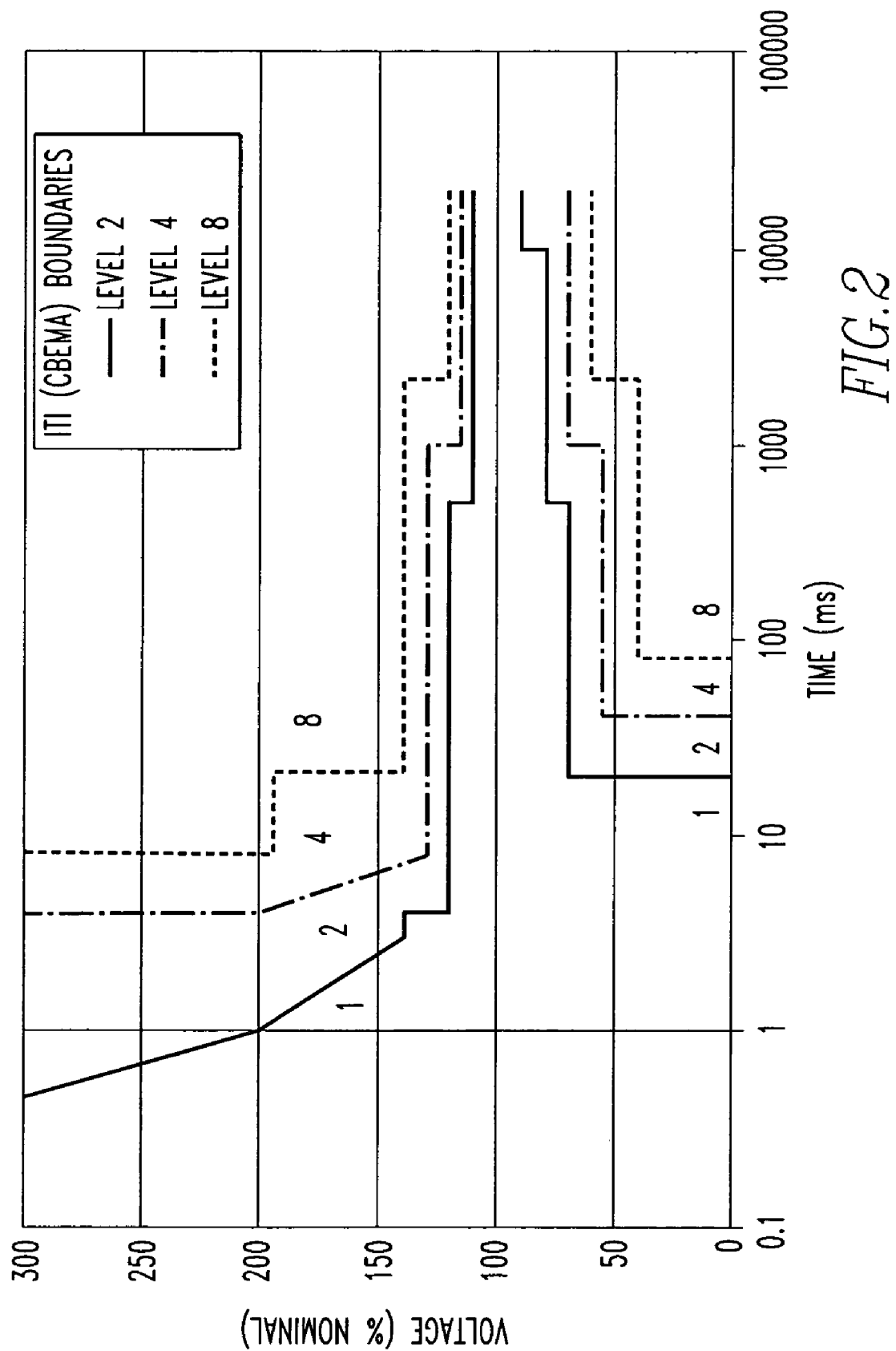
FIG. 2 is CBEMA curve of ITI classifying voltage sags and swells by duration and severity of change in the rms voltage level.

Sags and swells in voltage are categorized according to the CBEMA/ITI curve established by the Information Technology Industry Council in 2000. This curve is illustrated in FIG. 2 and assigns a numerical value for the severity of duration and amplitude of a deviation in the rms voltage level. A voltage at or near the nominal 100% level has a severity of zero; however, an event that approaches the ITI level is scored as a one. More severe events are scored as two, four, or the highest level of eight. FIG. 2 indicates those categories for both sags and swells. As mentioned above, a calculation of the composite power quality index is made every ten minutes in the exemplary system. Of course, a longer or shorter data gathering period could be used. During this ten-minute period, the voltages and currents are repetitively sampled and values of the selected parameters are determined. The worse case category of sag and swell are recorded for the data recording period, e.g., ten minutes.

For the dv/dt parameter, the number of events during which dv/dt exceeds a selected threshold are counted. The total harmonic distortion for voltage is determined as a percentage with respect to a nominal voltage. Similarly, the total harmonic distortion of the current is measured as a percentage of full-scale current. Flicker is measured as Pst in accordance with EN61000-4-15 established by British Standards Institute (BSI).

Returning to FIG. 1, it can therefore be seen that the processor 13 includes modules for determining the rms value of voltage at 17, categorizes the severity of the sags and swells at 19 and determines the maximum of each during the data gathering period at 21.

The processor 13 detects the dv/dt at 23 and counts the number of times that dv/dt exceeds a threshold at 25. A fast Fourier transform is used at 27 to determine the total harmonic distortion of the current and voltage which is averaged over the data gathering period at 29. A flicker meter 31 detects flicker in the voltages to establish a Pst at 33.

Another aspect of the invention is providing the user with the capability of selecting a relative importance of each of the individual parameters. Thus, the user can establish, and even change, weighting factors W0–W5 to be applied to the respective parameters as indicated at 35. Since, as statistics are gathered over time the actual experience can deviate from the user assigned weightings, sensitivities are dynamically adjusted at 37 and used to maintain the user designated weightings.

As will be described more fully, the sensitivities and weighting factors are applied to the calculated parameters at 39 to generate a component power quality, PQ0–PQ5, for each of the selected parameters as indicated at 41. The component power qualities are combined by summing at 43 to produce the composite power quality indicator. The processor 13 also includes means for determining the long-term mean of the composite power quality indicator and of each of the component power qualities at 45. The processor then determines the standard deviation of the long-term power quality indicator and from this establishes at least one, but in the exemplary embodiment, two thresholds for the composite power quality indicator. In the exemplary monitor, the first threshold is set at three standard deviations and the second at six standard deviations of the long-term composite power quality indicator.

The display 15 generates a visual representation 47 of the power quality indicator relative to the long-term mean of the composite power quality indicator represented by the line 49. The addition of the first threshold 51 and the second threshold 53 delimits three zones for the power quality indicator: a normal zone 55 below the first threshold 51, a caution zone 57 between the first and second thresholds 51 and 53 and an alert zone 59 above the second threshold 53.

Figure 3:
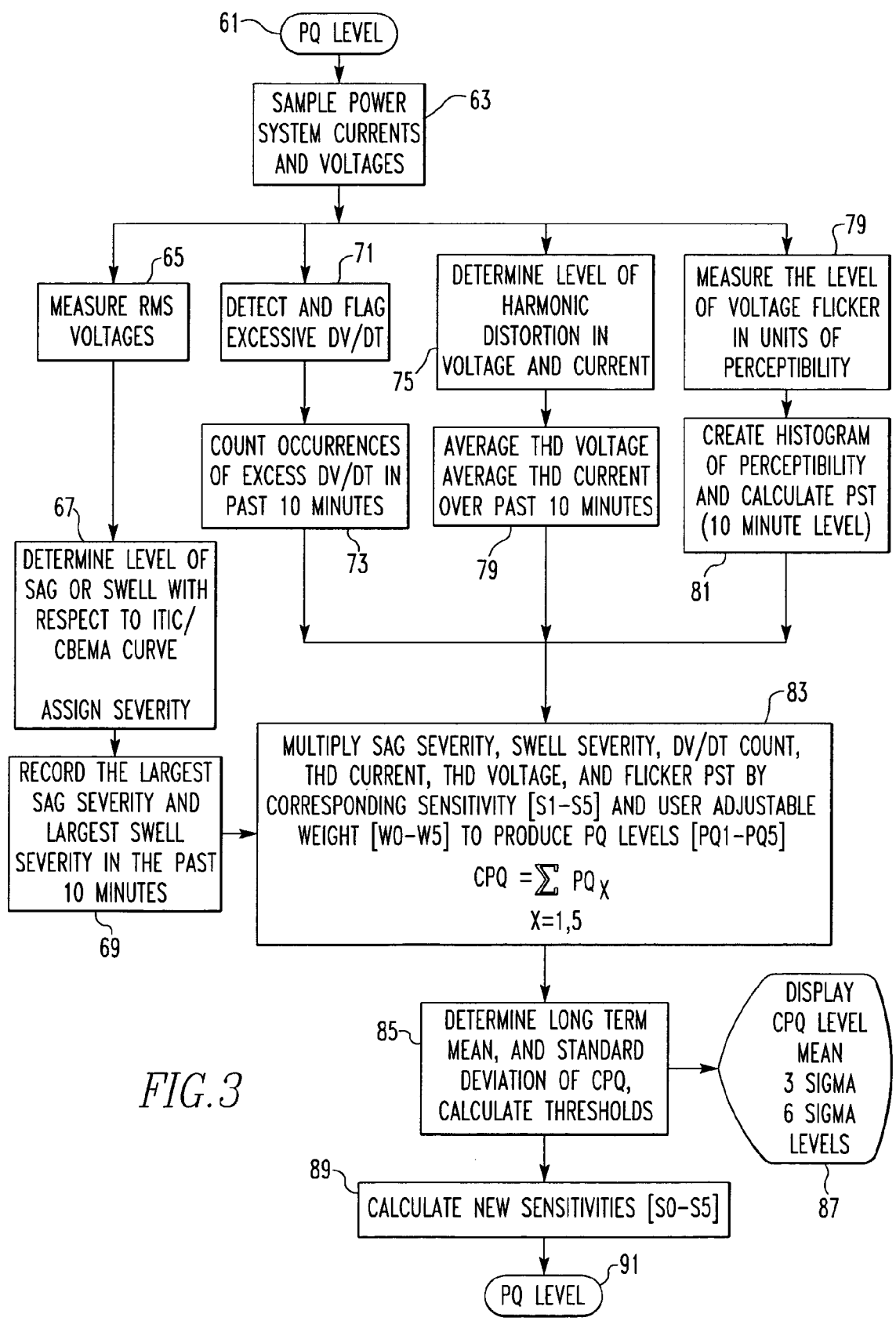
FIG. 3 is a flow chart showing operation of the power quality monitor of FIG. 1.

FIG. 3 is a flow chart 61 illustrating the operation of the processor 13. The power system currents and voltages are sampled repetitively as indicated at 63. The sampling rate is greater than two times the highest harmonic frequency of interest, typically 64 samples/cycle or greater. The routine then performs several functions in parallel. As indicated at 65, the rms voltages are calculated and then evaluated at 67 with respect to the CBEMA/ITI curve to detect the occurrence of any sag or swell which are then each assigned a severity. The largest sag severity and largest swell severity during the data gathering period, e.g., ten minutes, are then recorded at 69.

Simultaneously with the evaluation of sags and swells, the voltage samples are processed at 71 to determine if there is excessive dv/dt. The occurrences of excessive dv/dt's in the sampling period are counted at 73. While this is being done, the levels of harmonic distortion in voltage and in current are determined at 75 and average values of total harmonic distortion of each during the ten-minute sampling period are calculated at 77. Flicker in the voltage in units of perceptibility is measured at 79. From this a histogram of perceptibility is created at 81 and used to calculate Pst for the sampling period.

At the conclusion of each sampling period, e.g., ten minutes in the exemplary system, the current composite power quality level, PQ, is calculated at 83. This is accomplished by multiplying each of the selected parameters: sag severity, swell severity, dv/dt count, THD current, THD voltage, and flicker Pst by a corresponding sensitivity, S0, S1, S2, S3, S4, S5, and a user-adjustable weight, W0, W2, W3, W4, W5, to produce component power quality levels PQ0, PQ1, PQ2, PQ3, PQ4, and PQ5. These component power quality levels are then summed to produce the composite power quality level CPQ.

Following this, the long-term mean and standard deviation of the composite PQ level, CPQ, are determined at 85. The standard deviation is then used to calculate the three sigma and six sigma thresholds. The long-term mean of CPQ and the thresholds are then used along with the most recent CPQ level generated in 83 to generate the display at 87. The sensitivity for each of the component power qualities are then calculated at 89. This requires calculating a long-term mean for each of the component power qualities. The adjusted sensitivity for each component power quality is then calculated as the most recent value multiplied by the corresponding weight assigned to that component power quality times the long-term mean of the composite power quality divided by the long-term mean of the respective component power quality. The program then loops back at 91 to 61 to initiate another sampling period.

EXAMPLE

In order to establish a statistical basis for normal conditions in an electric power distribution system, data must be collected over the long term. In the exemplary system, a moving average of the composite power quality is maintained over a one-year period. Because this would require the collection of data for one year before the system could be fully utilized, initial calculations of the composite power quality are generated using a one-week moving average. When 52 weeks of data have been accumulated, then the one-year moving average is used. Thus, a first, one-week, long-term moving average is utilized until enough data has been collected for a second long-term moving average, e.g., one year, has been accumulated. In the example, the following Equation 1 is used to calculate the one-week moving average:

$$\mu_w = \frac{1}{1008}[1007\mu_{w-1} + PQ] \quad \text{Eq. (1)}$$

Data is calculated for ten-minute intervals, there being 1008 ten-minute intervals in a week.

The weekly averages are then utilized to generate the second long-term mean, e.g., one-year moving average, using the following formula:

$$\mu_{avg} = \frac{1}{52}[51\mu_{avg-1} + \mu_w] \quad \text{Eq. (2)}$$

These formulas 1 and 2 are used to generate the long-term means for both the composite power quality indication and the individual component power qualities.

A moving average of the variance of the composite power quality index is generated in the example using the following formula:

$$\sigma_x^2 = \frac{1}{1008}[1007\sigma_{x-1}^2 + (PQ - \mu_w)^2] \quad \text{Eq. (3)}$$

A moving average of the standard deviation, which is the square root of the variance, over one year is calculated by the formula:

$$\sigma_{avg} = \frac{1}{52}[51\sigma_{avg-1} + \sigma_x] \quad \text{Eq. (4)}$$

The first and second thresholds in the example are three times $\sigma_{avg}$ and six times $\sigma_{avg}$. The three $\sigma_{avg}$ is added to the long-term mean of the composite power quality, $\mu_{avg}$ to generate the first threshold 51 shown in FIG. 1 and six $\mu_{avg}$ is added to the long-term mean, $\mu_{avg}$, to generate the second threshold 53.

At the end of each data-gathering period, e.g., ten minutes, the component power quality levels for each of the selected parameters are calculated and summed to produce the composite power quality. Table 1 below illustrates an example of this process.

TABLE 1

| Component | Level | Sensitivity | Normalized Level | Weight Setting | PQ |
|---|---|---|---|---|---|
| Sag | 0.25 | 0.125 | 0.03125 | 4 | 0.125 |
| Swell | 0.25 | 0.25 | 0.0625 | 2 | 0.125 |
| dv/dt | 0.1 | 1 | 0.1 | 1 | 0.1 |
| THD V (%) | 0.02 | 20 | 0.4 | 1 | 0.4 |
| THD I (% of FS) | 0.2 | 3.3 | 0.66 | 1 | 0.66 |
| Flicker (Pst) | 0.8 | 5 | 4 | 1 | 4 |
| | | | | CPQ = | 5.41 |

The first column lists the parameter. The total harmonic distortion of the current (THD I) is measured as a percentage (%) of the full scale current (FS). The level recorded in the second column is the average value of the parameter during the data-gathering period. For instance, the average value of sag over the last ten-minute period was 0.25. The level of each component is multiplied by the sensitivity in the third column to produce a normalized level in the fourth column. As previously explained, the sensitivity normalizes the levels to maintain the user selected weighting, which is listed in the fifth column. Multiplying the normalized level by the weight setting produces the component power quality in the last column. All of the component power qualities are added to produce the composite power quality, CPQ, which for the exemplary statistics is 5.41. Using the same statistics, σ is 0.715 so that three σ is 2.145 and six σ is 4.29, each of which would be added to the moving average of CPQ calculated at the conclusion of the previous data collection period to which the current CPQ of 5.41 would be compared.

As can be seen from Table 1, for the assumed statistics, the weighting of the component power qualities has migrated from the user weight settings. For instance, the flicker Pst has a value of 4 compared to a sag value of 0.125, while under the desire weight setting, the sag would have four times the influence of the flicker. Accordingly, the sensitivities of the component power qualities are adjusted to restore the desired weighting. The sensitivity $S_x$ for each component $PQ_x$, is calculated by the formula $$S_x(n) = \frac{S_x(n-1) * W_x * CPQ_m}{PQ_{xm}} \quad \text{Eq. (5)}$$

where $W_x$ is the user-assigned weighting factor for that component PQ, $CPQ_m$ is the long-term mean of the composite power quality, $PQ_{xm}$ is the long-term mean of that component power quality, and n is the sampling period.

Using the exemplary statistics, the adjusted sensitivities for each of the component PQs is shown in the third column of Table 2 below. The levels of the component PQs from Table 1 are multiplied by the adjusted sensitivities to generate new normalized levels, which when multiplied by the user-selected weight settings, produce adjusted component power qualities. While the adjusted component power qualities in Table 2 differ from those in Table 1, it can be seen that when added together the composite power quality, CPQ, remains the same.

TABLE 2

| Component | Level | Adjusted Sensitivity | Normalized Level | Weight Setting | Adjusted PQ |
|---|---|---|---|---|---|
| Sag | 0.25 | 2.16 | 0.541 | 4 | 2.164 |
| Swell | 0.25 | 2.16 | 0.541 | 2 | 1.082 |
| dv/dt | 0.1 | 5.41 | 0.541 | 1 | 0.541 |
| THD V (%) | 0.02 | 27.05 | 0.541 | 1 | 0.541 |
| THD I (% of FS) | 0.2 | 2.71 | 0.541 | 1 | 0.541 |
| Flicker (Pst) | 0.8 | 0.68 | 0.541 | 1 | 0.541 |
| | | | | CPQ = | 5.41 |

The examples above show a rather large change in the relative contributions of the component power qualities, which would normally not occur, but are used for illustrative purposes. It can be seen from this example though that the composite power quality continually adjusts to conditions in the distribution system to continually update what is normal. A significant change in the level of a parameter, especially a heavily-weighted one, can cause the composite power quality indication to make an excursion beyond one or both thresholds, thus alerting the operator to a condition which warrants further investigation. Reference to the current values of the component power qualities would indicate the source of the excursion.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

What is claimed is:

1. A method of monitoring power quality in an electric power distribution system comprising:
    repetitively determining values of a plurality of selected parameters of the electric power distribution system;
    generating a composite power quality indicator from the values of the plurality of selected parameters;
    generating an output representing the composite power quality indicator;
    wherein generating the composite power quality indicator comprises generating a power quality component for each of the plurality of selected parameters and combining the power quality components to produce the composite power quality indicator; and
    wherein combining the power quality components to produce the composite power quality indicator comprises assigning each power quality component an associated weighting factor selected to produce a selected weighting of the power quality component, multiplying each power quality component by that power quality component's selected weighting factor to generate the power quality component and adding the weighted power quality components to generate the power quality index.

2. The method of claim 1, wherein combining the power quality components further comprises maintaining the selected weighting by establishing a power quality component sensitivity for each of the plurality of selected parameters and multiplying the power quality component by the power quality component sensitivity and the associated weighting factor.

3. The method of claim 2, wherein establishing each power quality component sensitivity comprises maintaining a long-term mean value for each power quality component and a long-term mean value for the composite power quality indicator, and multiplying the associated weighting factor by a ratio of the composite power quality indicator long-term mean value to the power quality component long-term mean value.

4. The method of claim 3, wherein establishing the power quality component sensitivity comprises updating each power quality component sensitivity by multiplying a most recent power quality component sensitivity by the associated weighting factor and the ratio of the composite power quality indicator long-term mean to the power quality component long-term mean.

5. The method of claim 4, wherein generating the composite power quality indicator further comprises generating at least one dynamic threshold for the composite quality indicator by generating a standard deviation of the long-term mean of the composite power quality indicator and generating the at least one dynamic threshold as a function of the standard deviation, and generating the output comprises generating a representation of the composite power quality indicator relative to the long-term mean of the composite power quality indicator and relative to the at least one dynamic threshold.

6. A method of monitoring power quality in an electric power distribution system comprising:
repetitively determining values of a plurality of selected parameters of the electric power distribution system;
generating a composite power quality indicator from the values of the plurality of selected parameters;
generating an output representing the composite power quality indicator; and
wherein generating the composite power quality indicator further comprises generating at least one dynamic threshold for the composite power quality indicator and wherein generating the output comprises generating a representation of the composite power quality indicator relative to the at least one dynamic threshold.

7. The method of claim 6, wherein generating the at least one dynamic threshold comprises generating a long-term mean of the composite power quality indicator, generating a standard deviation of the long-term mean of the composite power quality indicator and generating the at least one dynamic threshold as a function of the standard deviation, and generating the output comprises generating a representation of the composite power quality indicator relative to the long-term mean of the composite power quality indicator as well as relative to the at least one dynamic threshold.

8. The method of claim 7, wherein generating the long-term mean of a composite power quality indicator comprises generating a moving average of the composite power quality indicator over a selected time period.

9. The method of claim 8, wherein generating the composite power quality indicator over the selected time period comprises generating a first moving average of the composite power quality indicator over a first time period and generating a second moving average of the composite power quality indicator over a second time period which is a multiple of the first time period, and generating the composite power quality indicator using only the first moving average until the method has been employed for the second time period and thereafter generating the composite quality indicator using the second moving average.

10. The method of claim 9, wherein the first time period is about one week and the second time period is about one year.

11. A power quality monitor for an electric power distribution system comprising:
sensors for sensing currents and voltages in the electric power distribution system;
processing means comprising means for repetitively determining values of selected parameters from the currents and voltages and for statistically generating a composite power quality indicator from the values of the selected parameters;
output means providing a representation of the composite power quality indicator,
wherein the process means comprises means generating a long-term mean of the composite power quality indicator and the output means comprises a display displaying the composite power quality indicator relative to the long-term mean of the composite power quality indicator; and
wherein the processing means further comprises means generating a standard deviation of the long-term mean of the composite power quality indicator and at least one dynamic threshold as a function of the standard deviation, and the display further displays the composite power quality indicator relative to the at least one dynamic threshold.

12. The monitor of claim 11, wherein the processing means comprises means generating a first dynamic threshold as a first function of the standard deviation and a second dynamic threshold as a second function of the standard deviation that is greater in value than the first function of the standard deviation, and wherein the display displays the first and second dynamic thresholds relative to the long-term mean of the composite power quality indicator to define a safe zone for the composite power quality indicator between the long-term mean of the power quality indicator and the first dynamic threshold, a caution zone between the first and second dynamic thresholds, and an alert zone farther from the long-term mean of the composite power quality indicator than the second dynamic threshold.

13. The monitor of claim 12, wherein the processing means comprises means generatuig power quality components from values of the selected parameters, means providing a selected weighting of each power quality component by applying a selected weighting factor to that power quality component to generate weighted power quality components, and means combining the weighted power quality components to generate the composite power quality indicator.

14. The monitor of claim 13, wherein the processing means further comprises means maintaining the weighting of each power quality component by applying a continually adjusted sensitivity to each weighted power quality component derived from the long-term mean of the composite power quality indicator and a long-term mean of the power quality component.

* * * * *